United States Patent
Guldi et al.

(10) Patent No.: US 6,267,122 B1
(45) Date of Patent: Jul. 31, 2001

(54) SEMICONDUCTOR CLEANING SOLUTION AND METHOD

(75) Inventors: Richard L. Guldi, Dallas; Jeffrey W. Ritchison, Plano, both of TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 08/119,785

(22) Filed: Sep. 10, 1993

(51) Int. Cl.[7] .................................................. B08B 3/12
(52) U.S. Cl. ............................. 134/1.3; 134/2; 134/25.4
(58) Field of Search .................... 134/2, 6, 3, 11, 134/34, 36, 42, 1; 252/156

(56) References Cited

U.S. PATENT DOCUMENTS

| | | | |
|---|---|---|---|
| 2,961,354 | * 11/1960 | Cleveland | 134/1 |
| 4,050,954 | * 9/1977 | Basi | 134/2 |
| 4,129,457 | * 12/1978 | Basi | 134/2 |
| 4,339,340 | * 7/1982 | Muraoka et al. | 134/34 |
| 4,430,152 | * 2/1984 | Okano | 156/643 |
| 4,867,799 | * 9/1989 | Grebinski | 134/11 |
| 5,259,888 | * 11/1993 | McCoy | 134/2 |
| 5,288,332 | * 2/1994 | Pustilnik et al. | 134/27 |

OTHER PUBLICATIONS

Tolliver, D. "LSI Wafer Cleaning Techniques". Solid State Technology, Nov. 1975 pp. 33–36.*

* cited by examiner

*Primary Examiner*—Lorna M. Douyon
(74) *Attorney, Agent, or Firm*—W. Daniel Swayze, Jr.; Wade James Brady, III; Frederick J. Telecky, Jr.

(57) ABSTRACT

An ammonium or amide aqueous solution without oxidzers for cleaning semiconductor wafers with exposed TiN (103). Effective particulate (109) removal occurs without the standard use of hydrogen peroxide which would attack the TiN (103). Solution temperatures up to 90° C. plus applied ultrasonic energy enhance the cleaning efficiency. Surfactants may be included.

5 Claims, 4 Drawing Sheets

SEMICONDUCTOR CLEANING SOLUTION AND METHOD

BACKGROUND OF THE INVENTION

The invention relates to electronic device fabrication, and, more particularly, to semiconductor cleaning.

Fabrication of integrated circuits on a wafer of semiconductor material such as silicon typically involves sequences of processing steps such as masked introduction of dopants (impurities effecting electrical characteristics) by ion implantation or diffusion, formation of insulating layers by oxidation or deposition followed by masked etching to make patterns, and formation of conductors by deposition of polycrystalline silicon (polysilicon) or metals also followed by masked etching to make patterns. And prior to each of these steps affecting the wafer surface, the surface must be cleaned to get rid of process chemicals from the prior steps in order to insure that the prescribed reaction occurs or the prescribed material interface arises. Contaminants and irregularities can affect electrical behavior, and cleanups may themselves introduce contaminants including heavy metals, alkali metals and light elements. Cleanups may also be the source of submicron sized particulates that are difficult to detect.

Wafer cleanups should remove gross organics and particulates, remove organic films, remove surface-adsorbed ions and plated metal contaminants, and sometimes remove surface oxide. Standard wafer cleanups include mechanical scrubbing in a liquid and ultrasonic agitation in deionized water (particulate removal), chemical cleaners such as solutions of "piranha" and "RCA cleanup" and choline cleanup, and dry cleaners such as ozone with ultraviolet light. Piranha is a solution of hydrogen peroxide ($H_2O_2$) and sulffric acid ($H_2SO_4$), and choline cleanup uses a solution of $H_2O_2$ with choline (($CH_3)_3N(CH_2CH_2OH)OH$) at 50° C. followed by an ultrasonic clean in deionized water and a deionized water rinse plus spin dry. RCA cleanup has up to three steps: first a removal of gross organics with perchloroethylene, next a removal of residual organic films with a basic solution of $H_2O_2$ and $NH_4OH$ followed by deionized water rinse and spin dry, and lastly a removal of metallics with an acidic solution of $H_2O_2$ and HCl again followed a deionized water rinse and spin dry. The solutions are used at 75–80° C. and essentially provide an oxidizing and complexing treatment which does not attack silicon or silicon dioxide (oxide). The basic solution cleanup alone is frequently called SC-1 and the acidic solution cleanup alone is called SC-2.

Current cleanup systems typically rely on the RCA cleanup as a pre-furnace cleanup. However, once a wafer has been metallized, then both the SC-1 and SC-2 cleanups must be abandoned in favor of other cleaners in order to avoid etching desired metal. The recent use of titanium nitride (TiN) cladding for aluminum or for coated contacts, gates, and emitters or as a standalone "local interconnect" conductor has created a problem in that both the SC-1 basic cleanup and the SC-2 acidic cleanup attack TiN. Thus cleanup for metallized wafers relies on solvents, such as N-methylpyrrolidine (NMP), or ultrasonic or spin rinse cleaning with deionized water. (Note that many organic solvents are flammable and thus cannot be used in ultrasonic cleaning baths due to the potential for explosion). But these cleanups have limited efficacy, and there is a need for better cleanups for metallized wafers, especially with exposed TiN.

SUMMARY OF THE INVENTION

The present invention provides ammonia and other amine solutions as a metallized wafer cleaner. These solutions may be used with ultrasonic cleaning, or alone and heated, or with both heated, ultrasonic cleaning.

BRIEF DESCRIPTION OF THE DRAWINGS

The drawings are schematic for clarity.

DESCRIPTION OF THE PREFERRED EMBODIMENTS

First Preferred Embodiment

Figure 1:
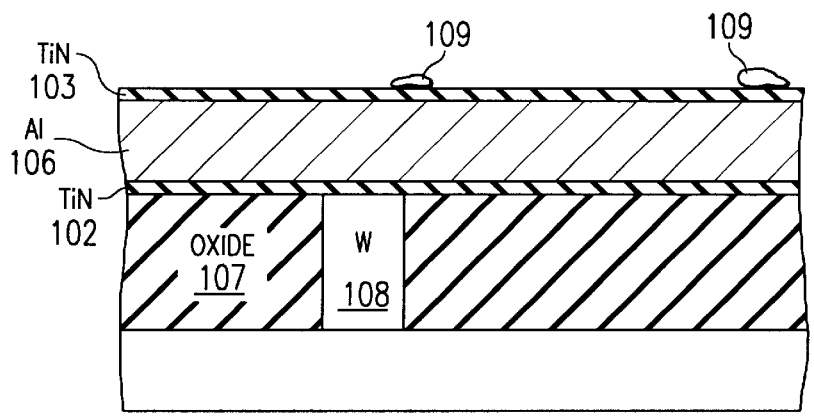
FIGS. 1–8 illustrate in cross sectional elevation view process steps including a first preferred embodiment method of cleaning.
Figure 2:
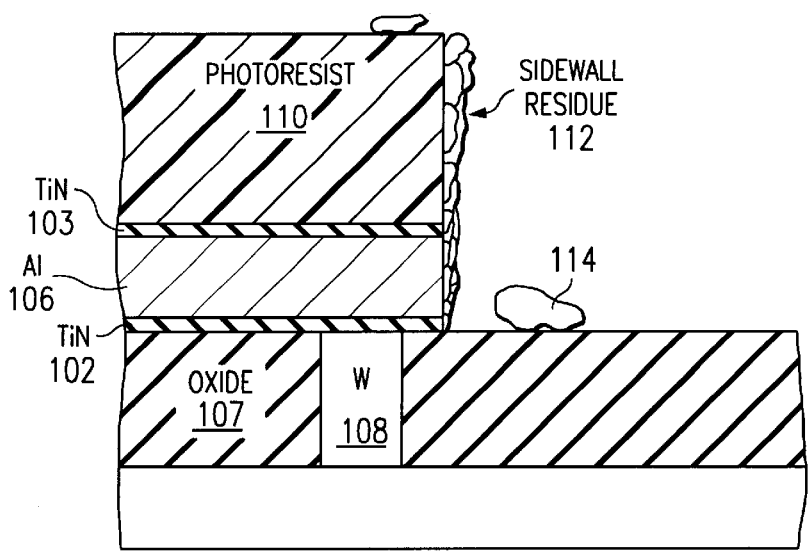

FIGS. 1–4 illustrate in cross sectional elevation views steps in silicon semiconductor wafer processing which include a first preferred embodiment method of wafer cleaning for wafers with exposed patterned metal. In particular, FIG. 1 shows the wafer after deposition of aluminum alloy layer 106 with cladding TiN layers 102–103 on either side Aluminum alloy 106 may be an alloy such as ½% silicon-copper (Al:Si:Cu) or ½% copper (Al:Cu); the bottom TiN layer 102 acts as a diffusion barrier to prevent aluminum 106 reaction with underlying items such as the tungsten plug 108, and the top TiN layer 103 acts as an antireflective coating to aid in the photolithography of the following steps. Tungsten plug 108 extends through an underlying oxide insulation layer 107 and provides vertical conductor connection. The TiN layers 102–103 typically will be on the order of 0.05 $\mu$m thick and deposited by chemical vapor deposition (CVD) or by reactive ion sputtering. The aluminum alloy layer typically will be on the order of 0.5 to 1 $\mu$m thick and deposited by sputtering.

The surface of the top TiN 103 attracts particulates, heuristically illustrated by particulates 109 in FIG. 1, at the final stages of the TiN deposition and characterizations, during transfer of the wafer for the following photolithography steps, and also during the etching of the TiN clad aluminum alloy. Particulate sources include the deposition chamber walls, the vacuum pumping system, and other sources such as the wafer handling and inspection.

To clean the top TiN surface of particulates, the first preferred embodiment method dips the metallized wafer in a bath of aqueous $NH_4OH$ at a temperature in the range of about 25–90° C. for from about five to twenty-five minutes. This solution does not attack TiN and provides particulate removal superior to a deionized water rinse. After the dip in $NH_4OH$, rinse the wafer with deionized water in a batch mode rinse tank or in a single wafer rinser to remove any traces of the $NH_4OH$ before drying.

Typically, the next processing steps pattern the TiN clad aluminum alloy into conducting lines (interconnects) and include photolithography. Thus begin the photolithography by spinning photoresist onto the cleaned wafer. Next, expose and develop a pattern in the photoresist to define the desired interconnects to be made from the deposited metal. Then reactive ion etch (RIE) the deposited metal using the patterned photoresist as the etch mask. Chlorine-based etches such as $BCl_3$ plus $Cl_2$ may be used. This etching creates a multitude of residues and particulates as illustrated heuristically in FIG. 2. in particular, the RIE creates residue 112 on the sidewalls of patterned photoresist 110 and etched aluminum alloy 106. Sidewall residue 112 typically includes inorganics such as aluminum hydrocarbon silicates and aluminum or titanium containing organic polymer chains depending upon the type of photoresist and etch chemistry used. Particulates such as 114 on the horizontal surfaces also arise and may have their sources in sidewall residue 112 or from etch by-products which accumulate in the etch equipment and get transferred to the wafer. The RIE creates numerous particulates of sizes in the range of 0.1–1.0 µm which are large enough to be fatal defects for processes with linewidths below 1 µm if located in critical areas but are small enough to be difficult to remove.

Figure 3:
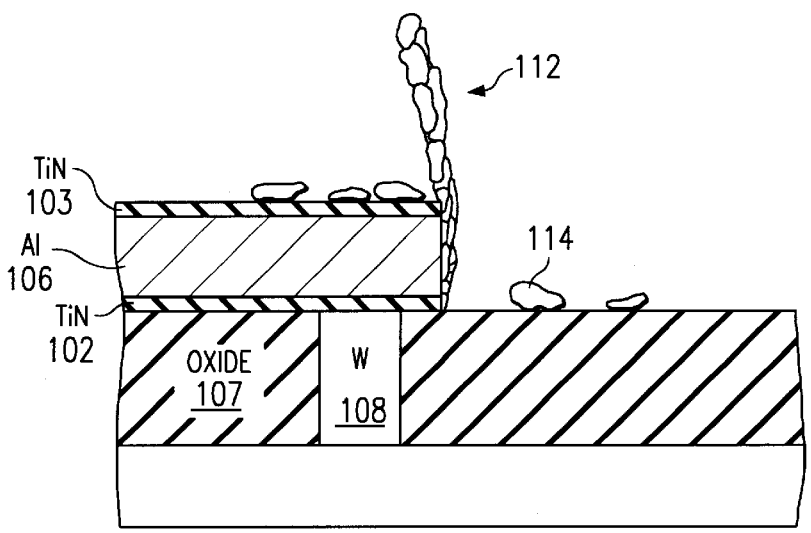

Next, the photoresist 110 is removed by an in-situ oxygen plasma (ash), by a dedicated oxygen asher, by solvent immersion, or by a combination of these. In-situ ashing is preferred because the wafer need not be removed from the etching chamber after the metal etch. Photoresist removal leaves the sidewall residue in tact, although oxidized and perhaps with more particulates dispersed on the patterned metal and the underlying exposed oxide as illustrated in FIG. 3.

Figure 4:
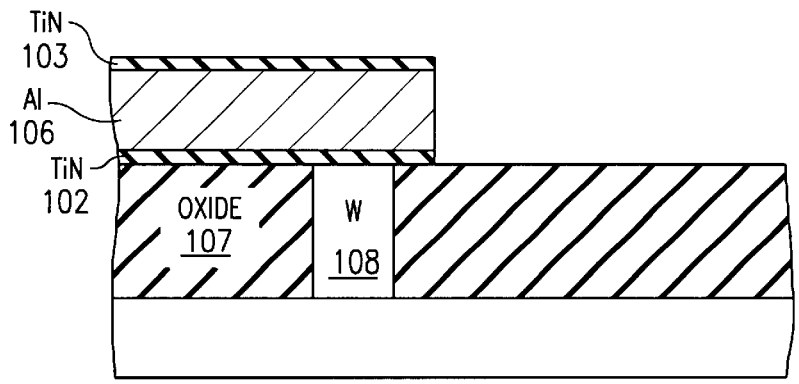

The preferred embodiment method cleans the etched and ashed wafer by first immersing in a solvent or by applying an RF vapor treatment. This removes the bulk of the etching residue. Next, again dip the metallized wafer in a bath of aqueous $NH_4OH$ at a temperature in the range of about 25–90° C. for from about five to twenty-five minutes. After the dip in $NH_4OH$, rinse the wafer with deionized water in a batch mode rinse tank or in a single wafer rinser to remove any traces of the $NH_4OH$ before drying. FIG. 4 illustrates the cleaned wafer.

The thus cleaned wafer is ready for deposition of the next insulation layer and, perhaps further metal layers. The cleanings with $NH_4OH$ provide better particulate removal than ultrasonic deionized water, and this may be due to the complexing power of the ammonium ion with metals and to improved wetability. The volume ratio of $NH_4OH$ to $H_2O$ in the solution could be from 0.0001 to 0.2 and still provide good results, although a ratio of 0.1 may be most convenient.

Figure 5:
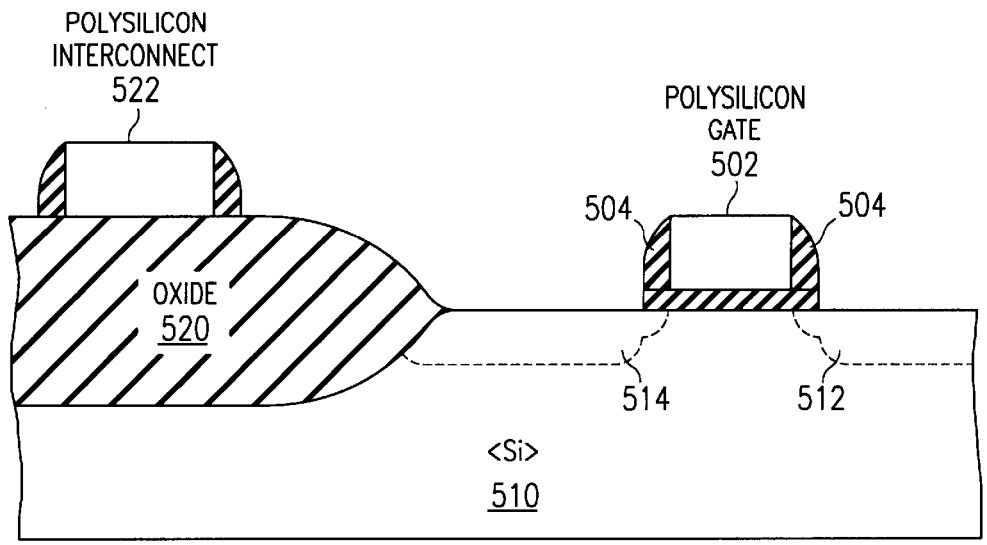
Figure 6:
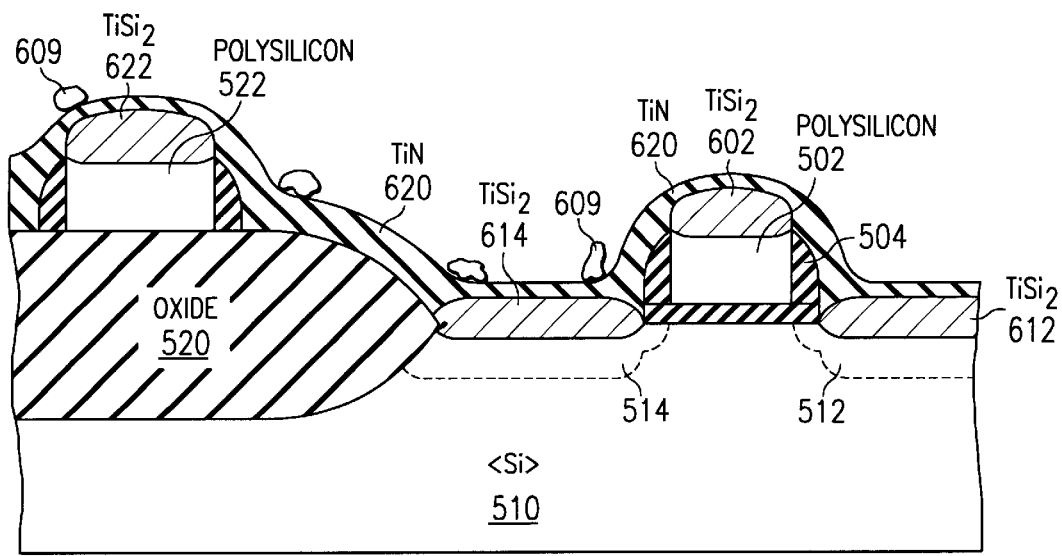

FIGS. 5–8 illustrate the use of the first preferred embodiment cleaning method for local interconnects in silicided silicon integrated circuits. In particular, FIG. 5 shows in cross sectional elevation view part of a CMOS integrated circuit during processing with polysilicon insulated gate 502 having sidewall spacer 504 and located on silicon substrate 510 between doped source 512 and drain 514 and with polysilicon first level interconnect 522 located on field oxide 520. The next processing step deposits a conformal layer of titanium metal (4–90 nm thick) and reacts the titanium with abutting silicon to form titanium silicide ($TiSi_2$) in furnace or rapid thermal annealer at 400–1000° C. for 1–60 minutes. A nitrogen atmosphere during the reaction prevents silicon migration through the metal by forming TiN in a competing reaction. FIG. 6 shows silicide 622 formed on polysilicon interconnect 522, silicide 602 on polysilicon gate 502, silicide 612 and 614 on source 512 and drain 514, and TiN 620 elsewhere. FIG. 6 also illustrates particulates 609 generated during the titanium deposition and the subsequent silicidation-nitridation reaction.

The first preferred method of cleaning with an aqueous solution of $NH_4OH$ and deionized water rinse again removes particulates 609. That is, dip the wafer in a bath of aqueous $NH_4OH$ at a temperature in the range of about 25–90° C. for from about five to twenty-five minutes. After the dip in $NH_4OH$, rinse the wafer with deionized water in a batch mode rinse tank or in a single wafer rinser to remove any traces of the $NH_4OH$ before drying.

Figure 7:
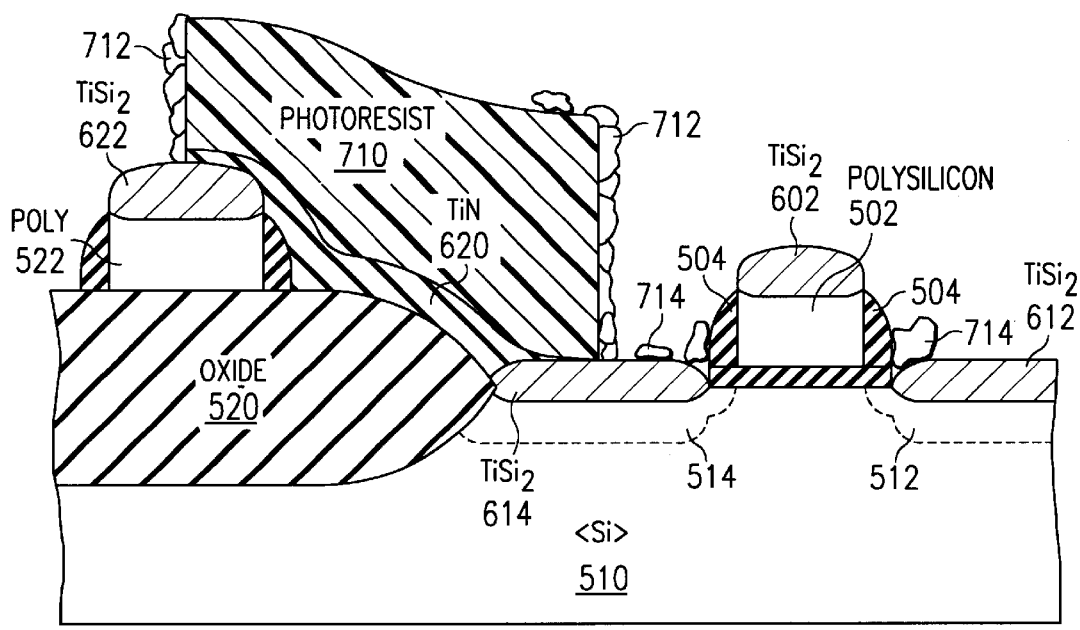

After cleaning, spin on and pattern photoresist to define local interconnections to be made from the TiN layer 620. Then use the patterned photoresist as an etch mask to etch the TiN, either with a chlorine plasma etch or a wet etch with $NH_4OH+H_2O_2+H_2O$ (which are the same ingredients as SC-1). As with the previously described etching of TiN-clad aluminum, the etching will leave residues 712 on the sidewalls of photoresist 710 and TiN 620 and particulates 714 elsewhere. The residues and particulates may derive from the photoresist plus TiN being etched plus the etchant. FIG. 7 illustrates etched TiN 620 as forming a local interconnect from silicided polysilicon interconnection 522-622 to silicided drain 514-614 plus the residue 712 and particulates 714.

Figure 8:
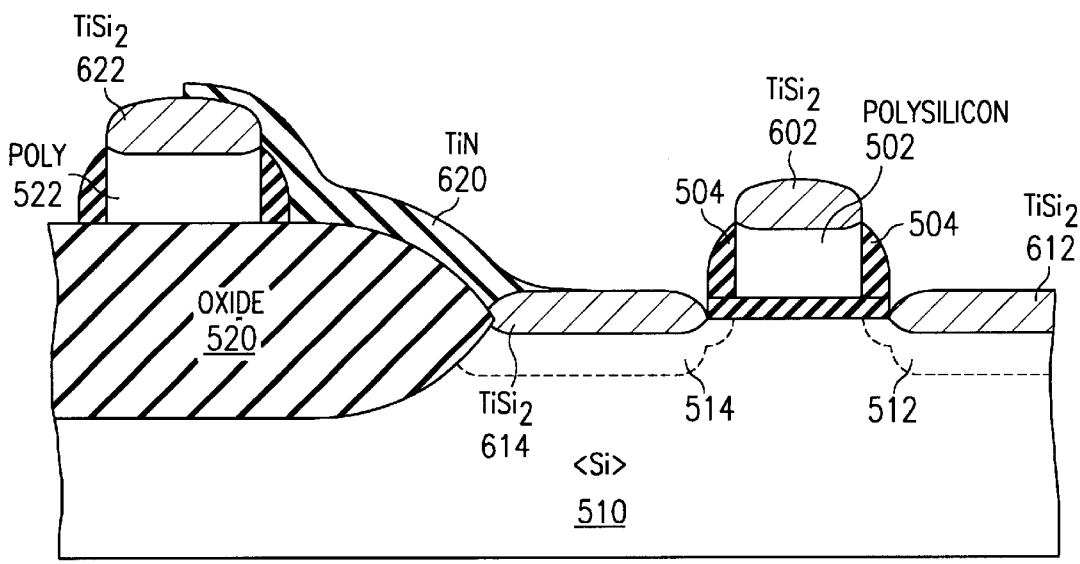

Again as with the TiN-clad aluminum etch, strip or ash photoresist 710, which will generate more particulates and leave the residues although perhaps in a oxidized form, and then remove the residues with a solvent rinse or a vapor HF treatment, generating more particulates. Lastly, again dip the metallized wafer in a bath of aqueous $NH_4OH$ at a temperature in the range of about 25–90° C. for from about five to twenty-five minutes. After the dip in $NH_4OH$, rinse the wafer with deionized water in a batch mode rinse tank or in a single wafer rinser to remove any traces of the $NH_4OH$ before drying. FIG. 8 shows the cleaned wafer with local interconnections ready for a deposition of a layer of insulation.

Second Preferred Embodiment

Figure 9:
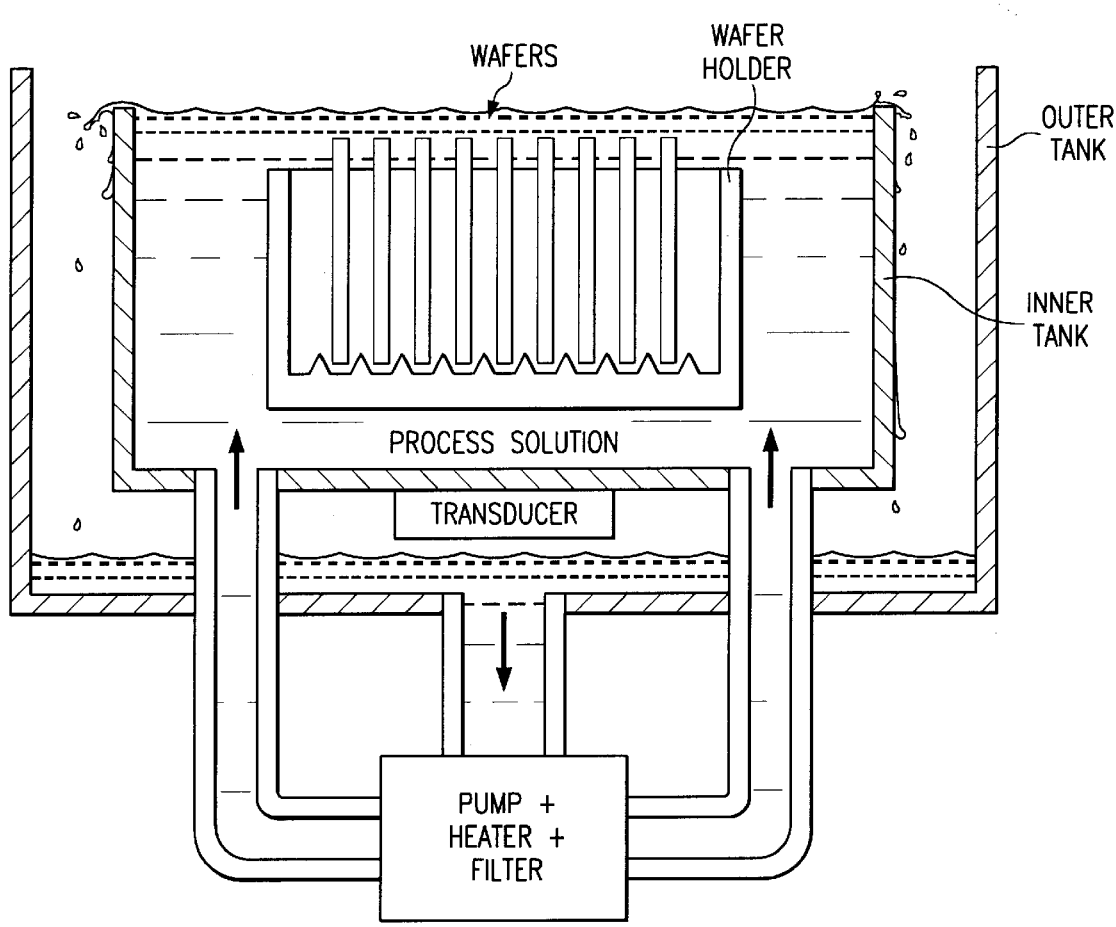
FIG. 9 shows an ultrasonic bath.

The second preferred embodiment also cleans metallized wafers with an $NH_4OH$ solution, but with the use of ultrasonic energy. In particular, FIG. 9 heuristically shows in cross sectional elevation view an ultrasonic bath with a transducer, a recirculating pump plus filter and heater, and a wafer holder full of wafers to be cleaned. A power oscillator drives the transducer at 500–1500 KHz which couples this energy into the bath $NH_4OH$ solution. The ultrasonic energy helps the bath solution dislodge particulates. The bath solution again is aqueous $NH_4OH$ at a temperature in the range of about 25–90° C. and again wafers are kept from about five to twenty-five minutes in the bath with application of ultrasonic energy. After the ultrasonic-assisted dip in $NH_4OH$, rinse the wafer with deionized water in a batch mode rinse tank or in a single wafer rinser to remove any traces of the $NH_4OH$ before drying. This ultrasonic cleaning step may be substituted for the hot $NH_4OH$ dip of the first preferred embodiment and may use the same concentrations of $NH_4OH$.

Third Preferred Embodiment

The third preferred embodiment also cleans metallized wafers, but with a quarternary ammonium ion in place of the $NH_4^+$ of the fist two preferred embodiments. In particular, a solution of $N(CH_3)_4OH$ (tetramethylammonium hydroxide) could be used at 25–90° C. in place of the $NH_4OH$ of the first and second preferred embodiments. More generally, a generic quarternary ammonium hydroxide, $NR_1R_2R_3R_4OH$, could be used where each $R_j$ is an alkyl or aryl group. The larger substitutions have the advantage of adjusting either solution wettability or complexing power. However, the larger substituted groups also imply flammability and limit the use of the solution in an ultrasonic bath. Again, a broad concentration range, such as a volume ratio of substituted quarternary ammnomium hydroxide to water of 0.0001 to 0.2, should provide good results. Also, mixtures of ammonium hydroxide and various quaternary ammonium hydroxides could be used.

Fourth Preferred Embodiment

The fourth preferred embodiment also cleans metallized wafers with a more generic compound replacing the ammonium hydroxide of the first two preferred embodiments. In particular, the complexing power of the nitrogen in ammonium hydroxide also appears in amines (compounds with an $NH_2$ functional group) such as ethylenediamine ($NH_2CH_2CH_2NH_2$) and these amines also do not attack TiN or $TiSi_2$. Indeed, ethylenediamine chelates various metal ions to aid cleaning. Thus primary, secondary, and tertiary amines (and hydrazes which resemble amines) such as methylamine ($N(CH_3)H_2$), dimethylamine ($N(CH_3)_2H$), and trimethylamine ($N(CH_3)_3$), respectively, with low molecular weight are water soluble and could be used in place of or in conjunction with the (quaternary) ammonium hydroxide(s) of the foregoing embodiments. Again, with increasing hydrocarbon character, the solutions have limited ultrasonic bath use.

Fifth Preferred Embodiment

The fifth preferred embodiment uses any of the solutions of the first four preferred embodiment in conjuction with a surfactant to enhance particulate removal. Surfactant such as NCW-601 typically include hydrophilic functional groups and have limited use in ultrasonic treatments.

Modifications and Advantages

The preferred embodiments may be used over a large range of concentrations, treatment times, and bath temperatures depending upon the particular demands, including solution lifetime, throughput, and cost. For example, treatment times from 15 seconds to several hours may be used; higher temperatures may be used in pressurized systems; and solutions of mixtures of various amines and ammonium hydroxide plus surfactants could be used.

The advantages of the ammonium or amine solutions for cleaning wafers with exposed TiN include the wetting and complexing in hot solutions with possible ultrasonic power to remove particulates without the TiN attack of peroxide solutions.

What is claimed is:

1. A method of wafer cleaning, comprising the steps of:
 (a) providing a wafer to be cleaned, said wafer with exposed metal regions; and
 (b) applying a solution consisting essentially of water plus ammonium hydroxide to said wafer while simultaneously applying an ultrasonic energy to said solution.

2. The method of claim 1, further comprising the step of:
 (a) after step (b) of claim 1, rinsing said wafer with water.

3. The method of claim 1, wherein:
 (a) said step of applying includes the step of adding a surfactant to the solution.

4. The method of claim 1, wherein:
 (a) said solution has a temperature in the range of 25–90° C.

5. The method of claim 1, wherein:
 (a) the ratio of ammonium hydroxide to water is in the range of 0.001 to 0.2.

* * * * *